United States Patent
Compaan et al.

(10) Patent No.: US 10,916,672 B2
(45) Date of Patent: Feb. 9, 2021

(54) METHOD OF MAKING A PHOTOVOLTAIC CELL, THE PHOTOVOLTAIC CELL MADE THEREWITH, AND AN ASSEMBLY INCLUDING THE SAME

(71) Applicant: Lucintech Inc, Toledo, OH (US)

(72) Inventors: Alvin D. Compaan, Holland, OH (US); Victor V. Plotnikov, Toledo, OH (US)

(73) Assignee: Lucintech Inc., Toledo, OH (US)

( * ) Notice: Subject to any disclaimer, the term of this patent is extended or adjusted under 35 U.S.C. 154(b) by 25 days.

(21) Appl. No.: 16/370,242

(22) Filed: Mar. 29, 2019

(65) Prior Publication Data

US 2019/0305166 A1    Oct. 3, 2019

Related U.S. Application Data

(60) Provisional application No. 62/650,889, filed on Mar. 30, 2018.

(51) Int. Cl.
*H01L 31/05* (2014.01)
*H01L 31/046* (2014.01)
*H01L 31/0224* (2006.01)

(52) U.S. Cl.
CPC .. *H01L 31/0512* (2013.01); *H01L 31/022425* (2013.01); *H01L 31/046* (2014.12)

(58) Field of Classification Search
None
See application file for complete search history.

(56) References Cited

U.S. PATENT DOCUMENTS

| | | | |
|---|---|---|---|
| 5,393,675 A | 2/1995 | Compaan | |
| 6,548,751 B2 | 4/2003 | Sverdrup, Jr. et al. | |
| 6,852,614 B1 | 2/2005 | Compaan et al. | |
| 7,141,863 B1 | 11/2006 | Compaan et al. | |
| 8,519,435 B2 | 8/2013 | Vasko et al. | |
| 2009/0047752 A1* | 2/2009 | Yamazaki | C23C 16/24 438/96 |
| 2011/0027973 A1* | 2/2011 | Su | C23C 16/54 438/478 |
| 2012/0153341 A1 | 6/2012 | Vasko et al. | |
| 2013/0068287 A1* | 3/2013 | Compaan | H01L 31/1864 136/249 |
| 2015/0111725 A1* | 4/2015 | Van Buskirk | B01J 21/063 502/200 |
| 2017/0148930 A1* | 5/2017 | Zhu | H01L 31/056 |

FOREIGN PATENT DOCUMENTS

WO    2015126918 A1    8/2015

OTHER PUBLICATIONS

Naba R. Paudel et al., Stability of sub-micron-thick CdTe solar cells, Progress in Photovoltaics: Research and Applications, Prog. Photovolt: Res. Appl. 2014: 22:107-114, Jun. 28, 2013, https://onlinelibrary.wiley.com/doi/10.1002/pip.2396.

* cited by examiner

Primary Examiner — Steven M Christopher
(74) Attorney, Agent, or Firm — Marshall & Melhorn, LLC

(57) ABSTRACT

A method of making a photovoltaic cell includes providing a metal oxide substrate. The substrate is at least translucent to light. The substrate is directed through a deposition chamber. A semiconductor is deposited over a first major surface of the substrate. The semiconductor includes a polycrystalline p-type layer. The semiconductor is exposed to a chlorine-containing compound or a chlorine molecule. A second electrode layer is provided over the semiconductor.

19 Claims, 5 Drawing Sheets

US 10,916,672 B2

METHOD OF MAKING A PHOTOVOLTAIC CELL, THE PHOTOVOLTAIC CELL MADE THEREWITH, AND AN ASSEMBLY INCLUDING THE SAME

CROSS-REFERENCE TO RELATED APPLICATION

This application is claiming the benefit, under 35 U.S. C. 119(e), of the provisional U.S. patent application which was granted Ser. No. 62/650,889 and filed on Mar. 30, 2018, the entire disclosure of which is hereby incorporated by reference.

BACKGROUND

The invention relates to a method of making a photovoltaic cell. The invention also relates to the photovoltaic cell made by the method and an assembly which includes such a photovoltaic cell.

A solar cell or photovoltaic cell is an example of diode structure where light enters the cell and energizes a semiconductor junction. Such cells may comprise a layered semiconductor junction and several additional layers. These layers can be formed on substrates using various deposition techniques. However, the substrates known in the art are relatively thick, heavy, and rigid. Furthermore, the photovoltaic cells known in the art require expensive encapsulation materials to protect the layers from degradation.

Thus, it would be desirable to provide a method of making a photovoltaic cell which overcomes the deficiencies described above. A photovoltaic cell and an assembly which, does not require the encapsulation materials noted above would also be desirable.

BRIEF SUMMARY

Embodiments of a method of making a photovoltaic cell are provided.

In an embodiment, the method comprises providing a metal oxide substrate. The substrate is at least translucent to light. The substrate is directed through a deposition chamber. A semiconductor is deposited over a first major surface of the substrate. The semiconductor comprises a polycrystalline p-type layer. The semiconductor is exposed to a chlorine-containing compound or a chlorine molecule. A second electrode layer is provided over the semiconductor.

In another embodiment, the method comprises providing a metal oxide substrate. The substrate is at least translucent to light. The substrate is directed through a deposition chamber. A first electrode layer is deposited over the substrate. A semiconductor junction having a polycrystalline n-type layer and p-type layer is deposited over the first electrode layer. The semiconductor junction is exposed to a chlorine-containing compound or a chlorine molecule at a temperature of 350° C. or more. A second electrode layer is provided over the semiconductor junction. An outer member is provided over the second electrode layer. The outer member and the substrate encapsulate the photovoltaic cell.

BRIEF DESCRIPTION OF THE SEVERAL VIEWS OF THE DRAWINGS

The above, as well as other advantages of the present invention will become readily apparent to those skilled in the art from the following detailed description when considered in the light of the accompanying drawings in which.

DETAILED DESCRIPTION

Figure 1:
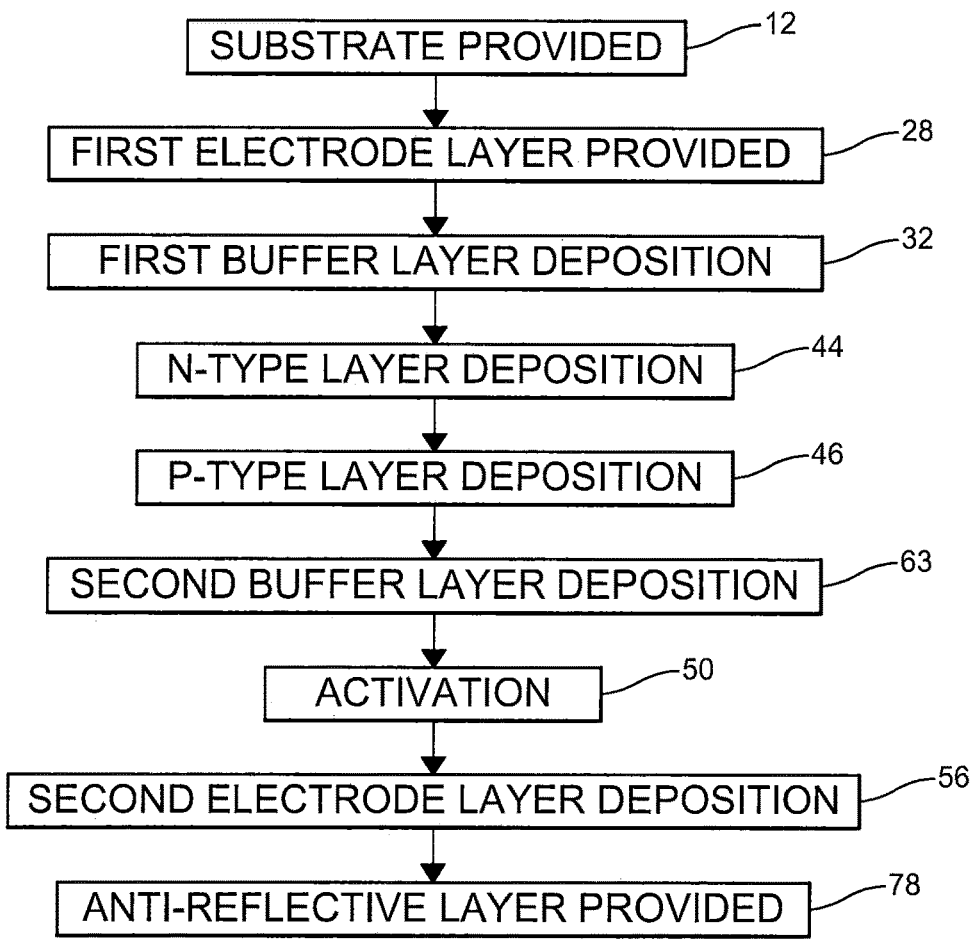
FIG. 1 is a schematic view of an embodiment of a method of making a photovoltaic cell in accordance with the invention.

It is to be understood that the invention may assume various alternative orientations and step sequences, except where expressly specified to the contrary. It is also to be understood that the methods, processes, articles, devices, and assemblies illustrated in the attached drawings, and described in the following specification are simply exemplary embodiments of the inventive concepts. Hence, specific dimensions, directions, or other physical characteristics relating to the embodiments disclosed are not to be considered as limiting, unless expressly stated otherwise.

Embodiments of a method of making a photovoltaic (PV) cell 10 are described herein. The method will be described below and with reference to FIGS. 1-6.

In a first step 12, the method comprises providing a substrate 14. Preferably, after being formed, the PV cell 10 is utilized so that the substrate 14 is provided in a superstrate configuration. That is, the PV cell 10 is turned upside down in operation so that sunlight enters through the substrate 14.

The composition of the substrate 14 is selected so that the substrate 14 is at least translucent. When the substrate 14 is translucent, the substrate 14 allows light to pass through but scatters the light passing through so that objects positioned on a side of the substrate 14 and viewed from an opposite side of the substrate may not be clearly observed. In some embodiments, the substrate 14 may also be transparent. In these embodiments, the substrate 14 does not scatter the light passing through it. Preferably, the substrate 14 is at least translucent to light in the wavelength region of 400-900 nm of the electromagnetic spectrum. More preferably, the substrate 14 is at least translucent to light in the wavelength region of 300-1500 nm of the electromagnetic spectrum. In some embodiments, the substrate 14 exhibits a light transmittance of 50% or more for light in the wavelength region of 400-900 nm of the electromagnetic spectrum. Preferably, the substrate 14 exhibits a light transmittance of 50-99% for the light in the wavelength region of 400-900 nm of the electromagnetic spectrum. In some embodiments, the substrate 14 exhibits a light transmittance of 50% or more for light in the wavelength region of 300-1500 nm of the electromagnetic spectrum.

Additionally, it is preferred that the substrate 14 is electrically insulating. In these embodiments, the substrate 14 may be comprised primarily of a metal oxide or another non-conductive material. When a metal oxide substrate 14 is provided, it is preferred that the substrate 14 comprise aluminum oxide ($Al_2O_3$) or yttria stabilized zirconium dioxide ($ZrO_2$). Preferably, the substrate 14 consists essentially of aluminum oxide ($Al_2O_3$) or yttria stabilized zirconium dioxide ($ZrO_2$). It is preferred that when the substrate 14 consists essentially of yttria stabilized zirconium dioxide ($ZrO_2$), the substrate includes 3% yttria ($Y_2O_3$) and may be referred to as 3YSZ. In these embodiments, the substrate 14 may be translucent to light.

Preferably, the thickness of the substrate 14 is selected so that the substrate 14 is flexible. When the substrate 14 is of the metal oxide variety, the thickness may be 10-40 microns. The thickness of substrate 14 is such that the substrate 14 may be provided as a sheet or as a ribbon. When the substrate 14 is provided as a ribbon, the substrate 14 has a length greater than its width. In certain embodiments, the substrate 14 may be provided as a roll. In some embodiments, the bending radius of the substrate 14 is 4 millimeters (mm) or more. In these embodiments, the PV cell 10 may be made using a roll-to-roll (R2R) method.

Figure 3:
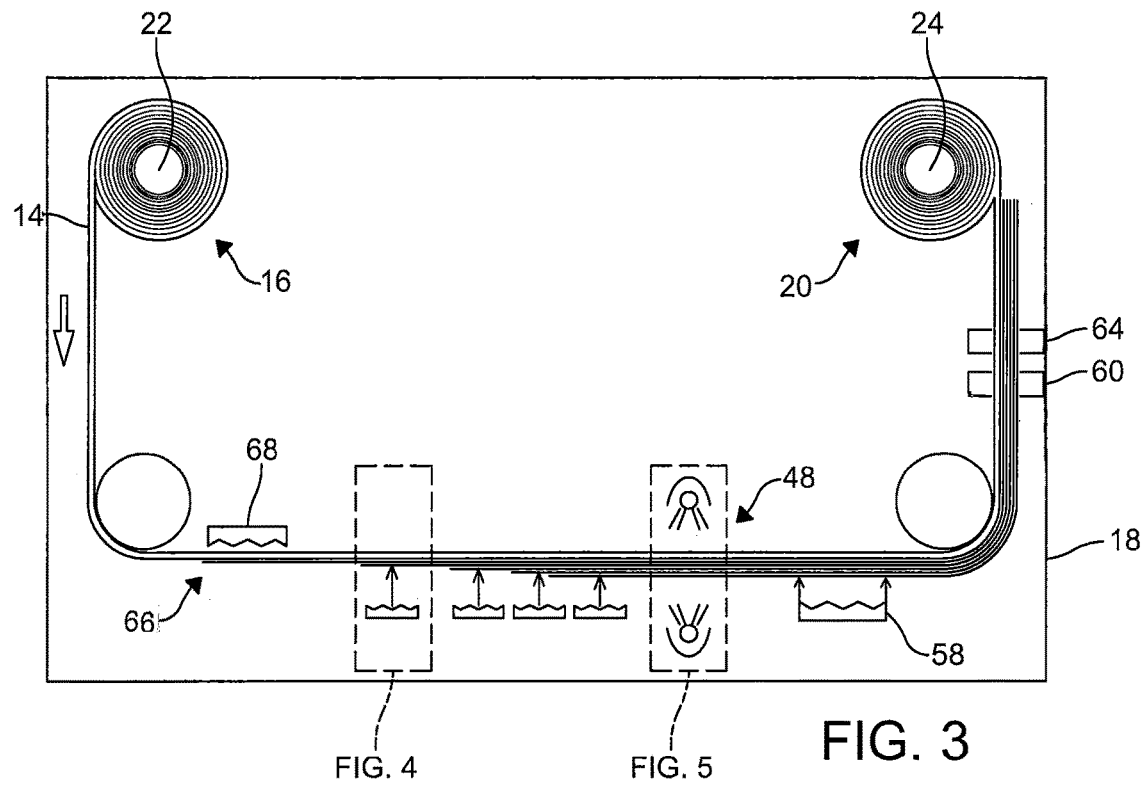
FIG. 3 is schematic view of an embodiment of an apparatus for use in the method.

An example of a roll-to-roll (R2R) method is illustrated in FIG. 3. When the PV cell 10 is made using an R2R method, the substrate 14 is provided as a roll 16 and unwound. After forming the PV cell 10, the PV cell 10 is wound into a roll 20 for storage, shipment, or additional processing. Separate devices may be provided for unwinding the substrate 14 and winding the PV cell 10 into a roll 20. When the substrate 14 is utilized in an R2R method, it may be provided as a ribbon. In these embodiments, the ribbon may be mounted on a pay-out drum 22. In an embodiment, the ribbon is directed through the deposition chamber 18 and attached to a take-up drum 24.

After providing the substrate 14 as a roll or in another form, the substrate 14 is directed through the deposition chamber 18. It should be appreciated that while the deposition chamber 18 is illustrated in FIG. 3 as a single chamber, the deposition chamber may comprise a plurality of sections due to the various deposition conditions required. In this embodiment, each section may be utilized to deposit a layer of the PV cell 10. When an R2R method is utilized, the substrate 14 may pass over several drums or be transported through sections of the deposition chamber 18 while it is heated or cooled and while the layers are deposited thereon. In these embodiments, each section may be maintained at a different pressure and/or temperature.

Figure 4:
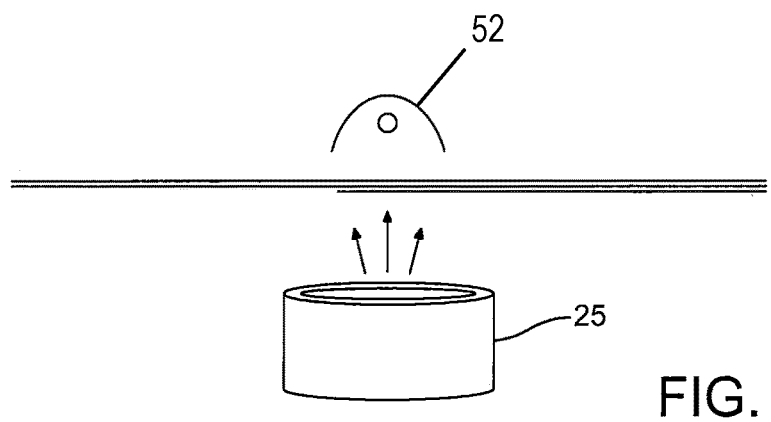
FIG. 4 is an enlarged view of an embodiment of a section of the apparatus of FIG. 3.

Within the deposition chamber 18, one or more layers of the PV cell 10 are deposited. A cleaning section 66 that may include a plasma or electrostatic generator 68 may also be provided in the deposition chamber 18 to clean the substrate 14 before the one or more layers of the PV cell 10 are deposited. The layers of the PV cell 10 may be deposited by one or more deposition techniques. Preferred deposition techniques include magnetron sputtering, thermal evaporation, close-spaced sublimation (CSS), vapor transport deposition (VTD), and other vapor deposition methods. An example of a magnetron sputtering device 25 is illustrated in FIG. 4. The use of a metal oxide substrate 14 is particularly advantageous with high temperature deposition methods such as CSS and VTD, which may require heating the substrate 14 to a high temperature prior to and during deposition. Preferably, when a magnetron sputtering deposition technique is utilized, it is of the unbalanced magnetic field variety. However, it should be appreciated that one or more of the layers may be deposited by another deposition technique such as, for example, molecular beam epitaxy or metal organic chemical vapor deposition or atomic layer deposition. It should also be appreciated that one or more of the layers may be provided prior to the substrate 14 entering the deposition chamber 18 and/or after leaving the deposition chamber 18. For example, a first electrode layer 26 and/or an anti-reflective layer 80 may be formed on the substrate before the substrate enters the deposition chamber.

In a next step 28, which is after the substrate 14 has been directed through the deposition chamber 18, the first electrode layer 26 may be provided over a first major surface 30 of the substrate 14. In an embodiment, the first electrode layer 26 is deposited over the first major surface 30 the substrate 14. Preferably, the first electrode layer 26 is deposited directly on the substrate 14. Preferably, the first electrode layer 26 has a high light transmittance. In an embodiment, the first electrode layer 26 has a total light transmittance of 80% or more. The first electrode layer 26 exhibits a first sheet resistance characteristic, as measured in ohms/square. Preferably, the first electrode layer 26 comprises a transparent conductive oxide (TCO). Preferred TCO materials include ZnO, MgZnO, ZnS, CdO, $SnO_2$:F, $In_2O_3$:Sn (ITO), $Cd_2SnO_4$, and related alloys. A doping material may be utilized to produce the desired sheet resistance of the first electrode layer 26. Preferably, the sheet resistance of the first electrode layer 26 is between 5 and 20 ohms/square. Any degradation of the first electrode layer 26 during the formation of the PV cell 10 or later processing may be limited to the extent that the sheet resistance of the TCO layer is maintained between 5 and 20 ohms/square and the total light transmittance remains at or above 80%.

In another step 32, a first buffer layer 34 may be deposited between the substrate 14 and the first electrode layer 26. In another embodiment, the first buffer layer 34 may be deposited over the first electrode layer 26. In this embodiment, the first buffer layer 34 is positioned between the first electrode layer 26 and a semiconductor 36. Preferably, the first buffer layer 34 comprises a material that allows it to be transparent to visible light and prevents diffusion of undesirable elements from the substrate through first electrode layer and into the semiconductor 36. The first buffer layer 34 may also assist in suppressing reflection due to the refractive index mismatch between the substrate 14 and the semiconductor layer 36. The first buffer layer 34 may have color suppression characteristics by suppression optical interferences. In some embodiments, the first buffer layer 34 may have a resistance characteristic to suppress shunting of photogenerated current in the semiconductor layers 38, 42. In some embodiments, the first buffer layer 34 may have an electron affinity characteristic that improves electron flow out of the semiconductor 36 into the first electrode layer 26. In some embodiments, the first buffer layer 34 may have an electron affinity characteristic that suppresses the flow of holes out of the semiconductor 36 into the first electrode layer 26. In other embodiments, the first buffer layer 34 may have an electron affinity characteristic that improves electron flow out of the semiconductor 36 into the first electrode layer 26 and suppresses the flow of holes out of the semiconductor 36 into the first electrode layer 26. The first buffer layer 34 may comprise $SiO_2$, $Al_2O_3$, $TiO_2$, $ZrO_2$, $SnO_2$, or similar transparent materials known to provide a barrier to diffusion. The first buffer layer 34 may be formed by introducing an inert gas, oxygen, and a precursor into the deposition chamber 18. The precursor may be one or more compounds that include one or more of a Zn, Al, and O element for depositing the first buffer layer 34 on either or both sides of the first electrode layer 26. Preferably, the first buffer layer 34 comprises from one or more of ZnO, ZnO(N), MgZnO, ZnS, CdO, SnO$_2$, and Zn$_2$SnO$_4$. The first buffer layer 34 may then be deposited in a manner sufficient to reduce shunting in the PV cell 10 and to substantially limit degradation of the first electrode layer 26.

Next, the semiconductor 36 is deposited over the first major surface 30 of the substrate 14. Preferably, the semiconductor 36 is deposited over the first electrode layer 26. In this embodiment, the first electrode layer 26 is positioned between the substrate 14 and the semiconductor 36. More preferably, the semiconductor 36 is deposited over the first buffer layer 34.

Figure 2:
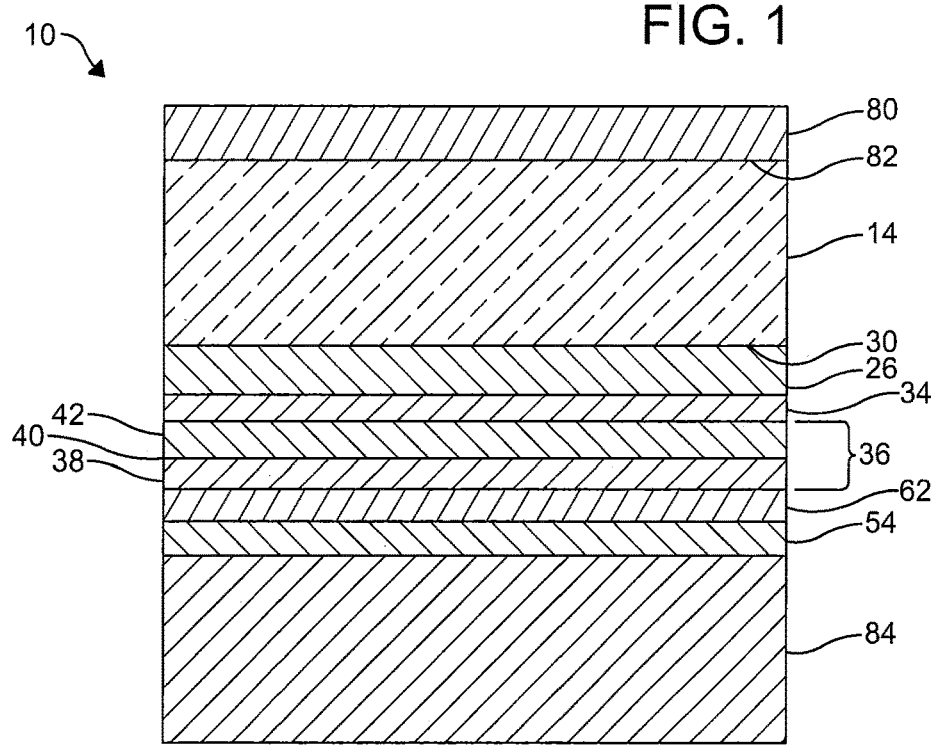
FIG. 2 is a sectional view of an embodiment of a photovoltaic cell made by an embodiment of the method.

In an embodiment, the semiconductor comprises a polycrystalline p-type layer 38. Preferably, the semiconductor comprises a semiconductor interface 40. Preferably, the semiconductor interface is defined between a polycrystalline n-type layer 42 and the polycrystalline p-type layer 38. Referring to FIG. 1, in some embodiments, the method comprises a step 44 of depositing the n-type layer 42. Deposition of the n-type layer 42 may precede a step 46 of depositing the p-type layer 38. In this embodiment, the n-type layer 42 may be deposited so that it is positioned between the first electrode layer 26 and the p-type layer 38, which is illustrated in FIG. 2. Preferably, the n-type layer 42 comprises cadmium sulfide (CdS) or cadmium selenide (CdSe) and p-type layer 38 comprises cadmium telluride (CdTe). Each layer 38, 42 may be deposited with a magnetron sputter apparatus as is illustrated. The preferred substrate temperature during deposition of each layer 38, 42 is about 250° C. When the n-type layer 42 comprises CdS, it is preferred that the n-type layer 42 has a thickness of about 50-80 nm. Alternatively, when the n-type layer 42 comprises CdSe, it is preferred that the n-type layer 42 has a thickness of about 50-500 nm. The p-type layer 38, which comprises CdTe, may have thickness from about 200 nm to about 3000 nm. The lower thickness range for the p-type layer 38 would be suitable for a semitransparent PV cell and a higher p-type thickness range of, for example, 750-3000 nm would be desired for higher efficiency PV cells. Other deposition methods may also be used, such as CSS and VTD that may require a substrate temperature of about 550° C. CSS and VTD are particularly advantageous for yielding high deposition rates desired for an R2R method.

In order to improve the efficiency of the PV cell 10, it is preferred that the semiconductor 36 is exposed to a chlorine-containing compound or a chlorine molecule. It is believed that such exposure passivates the grain boundaries in the semiconductor, which helps to prevent electron-hole recombination. Preferably, the chlorine-containing compound is CdCl$_2$, MgCl$_2$, or another chlorine-containing compound. Exposing the semiconductor 36 to a chlorine-containing compound or a chlorine molecule may enable the PV cell 10 to exhibit a PV cell efficiency of at least about 10%. Exposing the semiconductor 36 to a treatment or "activation" with a chlorine-containing compound or a chlorine molecule is believed to passivate grain boundaries, promote interdiffusion between the n-type semiconductor and the p-type semiconductor, and improve free carrier concentrations in the semiconductors.

It is preferred that the semiconductor 36 is deposited on the substrate 14 once the suitable pressures and temperatures are reached in the deposition chamber 18, one or more magnetron sputtering apparatuses, or CSS or VTD apparatuses, or other sources are started, and an activation section heated. Exposing the semiconductor 36 to a treatment or "activation" with a chlorine-containing compound or a chlorine molecule occurs in an activation section of the deposition chamber. However, it should be appreciated that the activation may also be performed off-line in a separate chamber.

Figure 5:
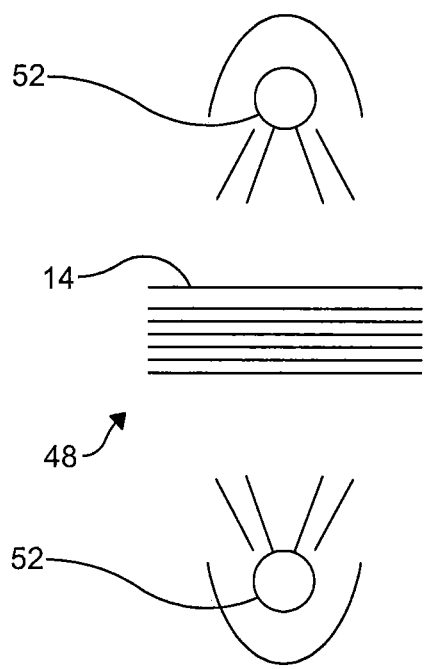
FIG. 5 is an enlarged view of an embodiment of another section of the apparatus of FIG. 3.

Within the activation section, an embodiment of which is illustrated in FIG. 5, a rapid thermal annealing (RTA) or activation step 50, which is illustrated in FIG. 1, may occur. The chlorine-containing compound or chlorine molecules may be applied to the semiconductor 36 prior to the RTA or during the RTA. An advantage to using certain embodiments of the substrate 14 noted above is that activation can occur more quickly and at higher temperatures. More particularly, when RTA is utilized, activation of the semiconductor 36 may be done either rapidly over a period of seconds or less, or more slowly in a period of minutes or hours. For example, depending on the temperature, RTA may occur over a time of 1 to 60 minutes or 1 microsecond to 10 seconds. Preferably, the temperature in the activation section 48 is 350° C. or more. In some embodiments, the temperature in the activation section 48 is 350-450° C. In other embodiments, the temperature in the activation section 48 may be 400-650° C. Lower temperatures in the activation section 48 may require longer activation/annealing times. In some embodiments, the RTA uses controllable heat sources 52, such as, for example, lamp heating, infrared heating, or flash lamp exposure to heat the activation section 48 to the temperatures noted above. These heat sources 52 are capable of providing a rapid temperature increase in the activation section 48 and may further provide rapid cooling sequences with cooled drums, for example. Some heat sources 52 and cooled drums are capable of rapidly heating one or more layers deposited on the substrate with little temperature rise of the substrate, which can allow the use of temperature-sensitive substrate ribbons.

The semiconductor 36 may be exposed to the chlorine-containing compound by spraying a solution into the activation section 48. In addition to a suitable chlorine-containing compound, the solution may comprise a solvent such as, for example, methanol, water or other solvent. Alternatively, the chlorine-containing compound or chlorine molecules may be provided as a vapor in a mixture using a carrier gas such as, for example, dry air or mixtures of O$_2$ and inert gases such as N2, He, or Ar. Solid sources for the chlorine-containing compound may be used, such as, CdCl$_2$, MgCl$_2$ and ZnCl$_2$, to provide the chlorine-containing compound in the activation section 48. Alternatively, a chlorine-containing compound such as trichloromethane (chloroform/CHCl$_3$) may be utilized.

The RTA may be performed in the activation section 48 and can be conducted as the PV cell 10 passes through a short heat zone. A larger heated zone can be created using one or more pulsed flash lamps or heat lamps. These heat sources may be rapidly cycled on and off, if so desired. Suitable heat sources 52 may also include infrared heating elements, microwave generated heating, or magnetic pulse heating using the stainless steel carrier as a heat conductor. In some embodiments, the heated zone may concentrate heat using one or more heat/optical reflectors to provide localized areas with higher temperatures.

In some embodiments, the activation section 48 includes a chloride treatment process within or adjacent to the heated zone. The chloride treatment process may comprise a chlorine vapor bath, where the vapors of, for example, CdCl$_2$, Cl$_2$, HCl, and Cd are provided. Gaseous O$_2$, N$_2$, Ar, and He may also be included with the vapors. The semiconductor 36 is exposed to heat and the vapor for a sufficient time, at the desired temperature, to passivate the interface 40 between the n-type layer 42 and the p-type layer 38 and grain boundaries to slow the recombination of electrons and holes. The step of exposing the semiconductor 36 to the chlorine-containing compound or chlorine molecules can be controlled such that the temperature may be in a range of about 350° C. to about 600° C. with an exposure time of 30 seconds to 120 minutes or 1 microsecond to 10 seconds utilizing pulsed flash lamps. In other embodiments (not depicted), the activation section 48 may be provided outside of the deposition chamber 18, to facilitate the activation at pressures near atmospheric pressure.

Referring back to FIGS. 1-3, after activation, a second electrode layer 54 is provided. Thus, in another step 56, the method may include depositing the second electrode layer 54. The method may also comprise providing a second electrode deposition apparatus 58. After the second electrode deposition apparatus 58, the PV cell 10 may be directed to a heat treatment station 60 to anneal the second electrode layer 54 and/or the second buffer layer 62. As illustrated in FIG. 3, the heat treatment station 60 may be provided in the deposition chamber 18. In other embodiments (not depicted), the heat treatment station 60 may be provided outside of the deposition chamber 18. In these embodiments, it may be desirable to anneal the second electrode layer 54 and/or the second buffer layer 62 at atmospheric pressure.

Also, as illustrated in FIG. 3, one or more scribing stations 64 may be provided in the deposition chamber 18. In other embodiments (not depicted), the one or more scribing stations 64 may be provided outside of the deposition chamber 18. In these embodiments, it may be desirable to scribe certain layers of the PV cell at atmospheric pressure. For example, the one or more scribing stations 64 may be provided to achieve the P1, P2, and P3 scribes through the first electrode layer 26, through the second buffer layer 62 and semiconductor 36, and through the second electrode layer 54.

Figure 6:
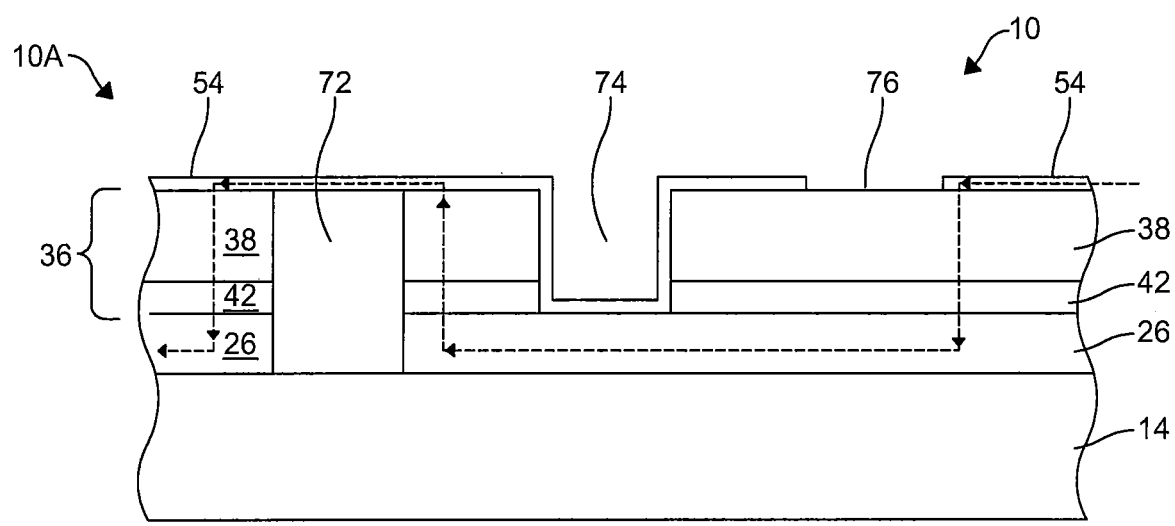
FIG. 6 is side view of a portion of an embodiment of the PV cell after performing a P1 scribe, filling the P1 scribe with a dielectric material, performing a P2 scribe, depositing a second electrode layer, and performing a P3 scribe.

The P1, P2, and P3 scribes described above are schematically illustrated in FIG. 6 and allow the PV cell 10 to be isolated from one or more adjacent PV cells 10A and monolithically series interconnected to the one or more adjacent PV cells 10A. Steps to series interconnect the PV cell 10 to an adjacent PV cell 10A include filling the P1 scribe with a dielectric material 72, which may also be a p-type layer comprising CdTe. Filling the P1 scribe with the dielectric material 72 may occur before, during, or after the P2 scribe, which is provided between the P1 scribe and the P3 scribe. In some embodiments, the P1 scribe may be filled with the dielectric material 72 prior to depositing the second electrode layer 54. The dielectric material 72 filling the P1 scribe may be delivered to the P1 scribe utilizing an inkjet device. The P2 scribe is illustrated in FIG. 6 by a removed portion 74 in the semiconductor 36. Preferably, the P1 scribe is separated from the P2 scribe by 25-250 microns and the P2 scribe is separated from the P3 scribe by 25-250 microns. The P3 scribe is illustrated in FIG. 6 by a removed portion 76 in the second electrode layer 54. In an embodiment, the P1 scribe may be separated from the P2 scribe by 100 microns and the P2 scribe may be separated from the P3 scribe by 100 microns. However, it should be appreciated that the P1 scribe may be separated from the P2 scribe by another distance or the P2 scribe may be separated from the P3 scribe by another distance.

As illustrated in FIG. 2, the second electrode layer 54 is deposited over the semiconductor 36. As noted above, a second buffer layer 62 may separate the semiconductor 36 from the second electrode layer 54. In some embodiments, the second buffer layer 62 is deposited by a step 63 that precedes the activation step 50. Preferably, the step 63 of depositing the second buffer layer 62 precedes the second electrode deposition step 56. The second buffer layer 62 may be deposited in a manner similar to the first buffer layer 34. The second buffer layer 62 may also be created by chemical treatments of the p-type layer 38. The second electrode layer 54 may be deposited by evaporation of about 1.5 to 3 nm of Cu and 10-20 nm of Au, followed by a heat treatment at 150-200° C. A variety of other materials may be used for the second electrode layer 54. These may include ZnTe:Cu, ZnTe:N, MoO, Mo, Cr, Al.

In an embodiment, the substrate 14 supports the layers of the PV cell 10 which may include 1) the deposition at about 250° C. or more of a first electrode layer 26 comprising ZnO:Al on the substrate 14; 2) deposition of a first buffer layer 34 comprising ZnO, which may be deposited by sputtering with Ar or with Ar and $N_2$; 3) the deposition at about 250° C. or more of the semiconductor 36, which comprises layers of CdS and CdTe; 4) exposing the semiconductor 36 to a temperature in the range of 350-450° C. and $CdCl_2$; and 5) deposition of the second electrode layer 54 via a metallization process, spray process, or printing process. Alternatively, the second electrode layer 54 may be preceded by the deposition of a second buffer layer 62 such as described in the Patent Application No. US20130174895, the entire disclosure of which is incorporated herein in its entirety. The deposition of the second electrode layer 54 may also be preceded by a shunt passivation step (not depicted) that electrically blocks pinholes and weak diodes in the layers of the semiconductor 36.

Referring now to FIGS. 1-2, in some embodiments, the method may comprise a step 78 of providing an anti-reflective coating 80 on the substrate 14. More particularly, the anti-reflective coating 80 may be deposited on a second major surface 82 of the substrate 14. The anti-reflective coating 80 may comprise one or more layers of transparent materials. The anti-reflective coating 80 is provided to improve the transmission of visible light through the substrate 14. Alternatively, the substrate 14 may be provided with the anti-reflective coating 80.

After forming the PV cell 10, the substrate 14 may be cut to a desired and predetermined length. For example, the substrate 14, with the PV cell 10 formed thereon, may be about one meter wide and 500 meters or more long. In other embodiments, the substrate 14 may be to 100 mm wide and up to 30 meters long. It should also be appreciated that the PV cell 10 may be formed on selected portions of the substrate 14. Thus, portions of the substrate 14 may not have any portion of the PV cell 10 formed thereon. After the PV cell 10 is interconnected to one or more additional PV cells 10A it can be removed from these portions of the substrate using a laser cutting method or another suitable method. For example, removing portions of the substrate may be accomplished with appropriate laser beams, preferably pulsed beams with pulse durations of tens of nanoseconds or less, with wavelengths preferably near 1.06 microns, 0.53 microns, or 0.35 microns. Such removed portions may enable the PV cell 10 to be provided in a wide range of predetermined shapes and sizes.

After sizing and shaping the PV cell(s), the PV cell(s) may be encapsulated using the substrate 14 and an outer member 84. Encapsulating the PV cell(s) protects the PV cell(s) from damage and environmental degradation. Because the superstrate configuration is used during operation and the superstrate may possess hermetic properties, such encapsulation may utilize an outer member 84 that comprises low cost polymeric materials or other suitable materials. When an encapsulation method is utilized, the outer member 84 is disposed over the second electrode layer 54. In an embodiment, the outer member 84 may comprise a metalized layer formed on a polymeric layer. Such a metalized layer may comprise aluminum, silver, or another metal that has a high visible light reflectance. When the outer member 84 is disposed over the second electrode layer 54, the polymeric layer separates the metalized layer from the second electrode layer 54. Additional members are suitable for use in encapsulating a PV cell 10 and will described below.

The PV cell 10 described herein may have a sunlight-to-electrical-power conversion efficiency of greater than 7%. Preferably, the PV cell 10 has an efficiency of 15% or more. Due to the flexibility of the PV cell 10, the PV cell 10 may be provided in a curved configuration so as to be applied to a curved surface or define a curved surface. In other embodiments, the very low weight per unit mass allows the PV cell 10 to exhibit 1500 watts per kilogram when exposed to direct sunlight.

After making the PV cell 10, the PV cell 10 can be utilized in electricity-producing building facades, rooftops, and other applications. Especially because of the very high power to mass ratio and flexibility, preferred applications include tents, canopies, roll-out PV blankets for remote charging of electronics and supplying of power for refrigeration. Such applications can include remote installations and are particularly advantageous for use following natural or man-made disasters. In certain embodiments, the PV cell 10 may have aerospace applications. In one such embodiment, a plurality of PV cells, monolithically interconnected with P1, P2, P3 scribes, could be utilized for a portion of an unmanned aerial vehicle (UAV).

In some embodiments, the mini-module 86 may be provided in an array of min-modules 88. In this embodiment, the array 88 may be utilized to define a portion of the wing, fuselage, or tail of the UAV. Such portions of the wing, fuselage, and tail may be upper outer facing surfaces and/or lower outer facing surfaces. In certain embodiments, mini-modules may define 40-100% of the outer facing surfaces of the wing, fuselage, or tail. Mini-modules are particularly attractive for providing very high coverage fractions because of the ease of sizing and shaping each PV cell and the ease of forming monolithically integrated modules with a variety of output voltages. One or more mini-modules may also be utilized to define other surfaces of the wing, fuselage, or tail.

Figure 8:
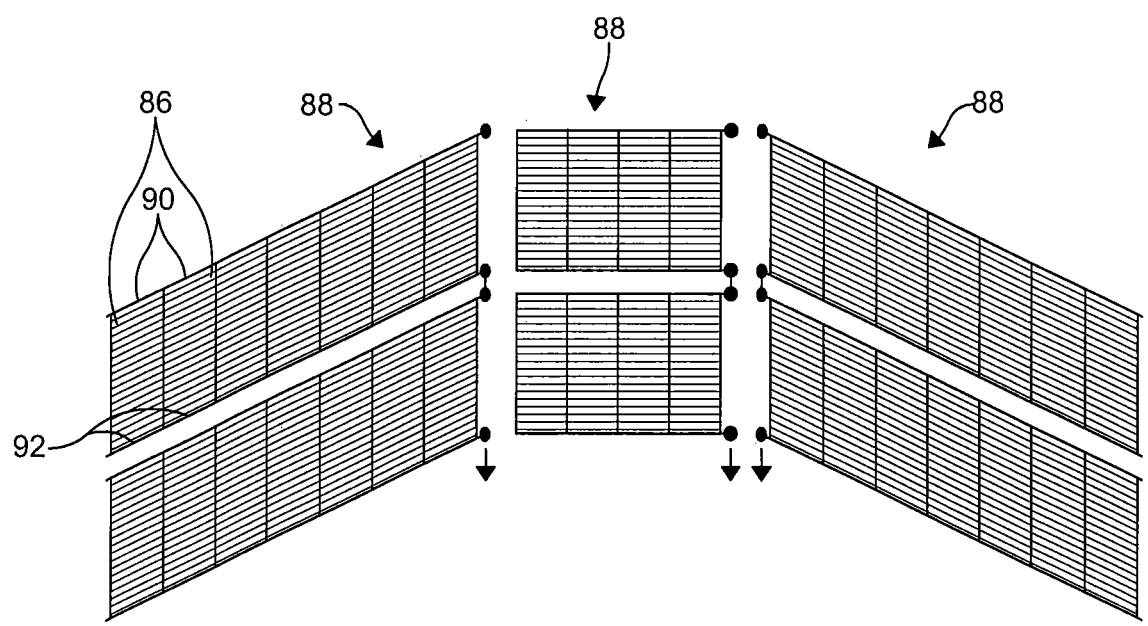
FIG. 8 is a perspective view of an embodiment of arrays of mini-modules.

In embodiments where the PV cells are utilized to cover a portion of a wing of the UAV, the scribes (P1, P2, and P3) described above may be provided in a parallel relationship with a long axis of the wing. Thus, in this embodiment, current generated by the PV cells would flow in a direction that is the same as the direction that the air flowing across the wing would flow. In this embodiment, the mini-modules may be electrically connected to each other in parallel, which is illustrated in FIG. 8 along with the direction of current flow. When two more mini-modules 86 are connected in parallel, the positive busbars 90 of each mini-module 86 are connected to each other and the negative busbars 92 of each mini-module 86 are connected to each other.

In embodiments where an array of mini-modules 88 is utilized to define a portion of a wing, the PV cell width may be tapered as the wing narrows to the tip. Advantageously, this configuration may include one or more PV cells that are narrower at or adjacent the tip and wider adjacent the base of the wing so that the current generation will decrease toward the wingtip, but the voltage produced by the PV mini-modules defining a portion of the wing is constant. This configuration also allows the mini-modules in the array to be connected in parallel.

Figure 7:
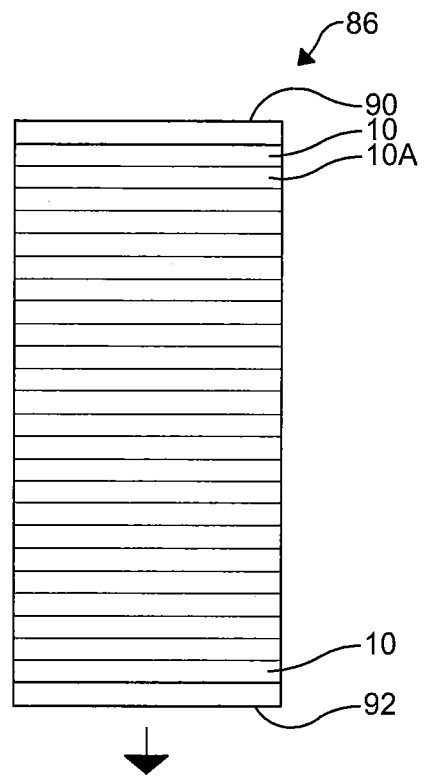
FIG. 7 is a top view of an embodiment of a mini-module that includes a photovoltaic cell in accordance with the invention.

A monolithically interconnected mini-module 86 suitable for a UAV wing section is shown in FIG. 7, which also shows the direction of current flow. The scribed interconnects may allow for a mini-module with a non-rectangular geometry that may facilitate high active-area PV coverage ratios in a UAV application. The mini-module 86 may comprise one or more PV cells 10. Preferably, the mini-module 86 comprises two or more PV cells 10, 10A, which are connected in a series configuration. Opposite polarity busbars 90, 92 may be provided at opposite ends of the mini-module 86. In an embodiment, the mini-module 86 may comprise a first busbar 90 in electrical communication with a PV cell 10 and a second busbar 92 in electrical communication with another PV cell 10. The first busbar 90 may provide a positive output and the second busbar 92 may provide a negative output or vice versa. For example, when the first busbar 90 provides a positive output from the mini-module 86, the second busbar 92 provides a negative output from the mini-module 86. It should also be noted that connecting mini-modules 86 comprising one or more of the PV cells minimizes the complexity of the wiring harness which connects the mini-module assemblies to a battery, motor, or another energy receiving member provided on the UAV.

Advantageously, in such an embodiment, the PV cells do not require an additional encapsulation layer. Furthermore, because the PV cells 10, 10A are in a superstrate configuration so that sunlight enters through the substrate 14, any encapsulant that is used on the back side need not be transparent to wavelengths of visible light. In these embodiments, the outer member 84 may be opaque. The outer member 84 may be a frame member or another portion of the wing, fuselage, or tail of the UAV. In this embodiment, the outer member 84 and substrate 14 protect the PV cells 10, 10A by providing a hermetic barrier that prevents damage to and environmental degradation of the PV cells 10, 10A. In an embodiment, the outer member 84 and the substrate 14 are secured to each other by an adhesive or another method.

In certain embodiments, predetermined wavelengths of light can be delivered to the UAV. Preferably, these predetermined wavelengths of light are produced by a laser (not depicted). It is preferred that such a laser be collimated over long distances and directable so that it can follow a moving object. Preferably, such wavelengths are close to the longest wavelengths that can be absorbed in an efficient manner by the semiconductor. In this embodiment, the wavelengths may be in the red or near IR portion of the electromagnetic spectrum. Such wavelengths can be in the range of 750-900 nm. Preferably, such wavelengths are in the range of 780-810 nm. Even more preferably, the wavelengths may be 780 nm or 808 nm. Wavelengths at 780 nm or 808 nm may allow for a high quantum efficiency such as, for example, between 85-95% and a high power conversion efficiency of, for example, 40-50%. Wavelengths at 780 nm or 808 nm may also allow for photogenerated current of more than 100 $A/m^2$. Preferably, the photogenerated current is less than about 10,000 $A/m^2$. The embodiments described above are preferred because they may be transmitted through dust, smoke, or clouds in a more efficient manner than other wavelengths and because some of such wavelengths can be seen by human eyes, which may provide for a measure of additional safety. In certain embodiments, wavelengths of 790-900 nm or more are preferred because such wavelengths generally cannot be seen by the human eye and may have advantages in certain security environments where low signatures are needed.

The predetermined wavelengths of light can be delivered to the UAV as a beam. The beam is supplied by one or more sources of power. The source of the beam can be land based, aerial, and/or in orbit in outer space. When the source is aerial, the source of the beam may be provided on a high altitude aircraft. When the source is in outer space, the source of the beam may be provided on a satellite.

The source may comprise one or more lasers. Preferably, each laser is of the solid-state and the power diode variety. In certain embodiments and when more than one laser is provided, the lasers may be configured as an array. Such lasers can deliver the predetermined wavelengths of light to provide power of about 0.1 W/cm$^2$, which is 1,000 W/m$^2$, which allows for a charging rate equivalent to 1 or more suns. Preferably, the charging rate is 1-10 suns. Advantageously, when light of up to 10 suns is delivered, the configuration of the PV cells 10 should facilitate cooling of the cells.

Delivering predetermined wavelengths of light enable the PV cells 10 to generate electricity that can be used by a motor and/or stored for later use by a battery provided on the UAV. By providing electricity, the PV cells may allow the UAV to operate for extended periods of time. Advantageously, after takeoff, the UAV may operate for a predetermined period of time. For example, with direct sun, the UAV could stay aloft during all daylight hours. With beaming, as described above, the UAV can stay aloft indefinitely.

Figure 9:
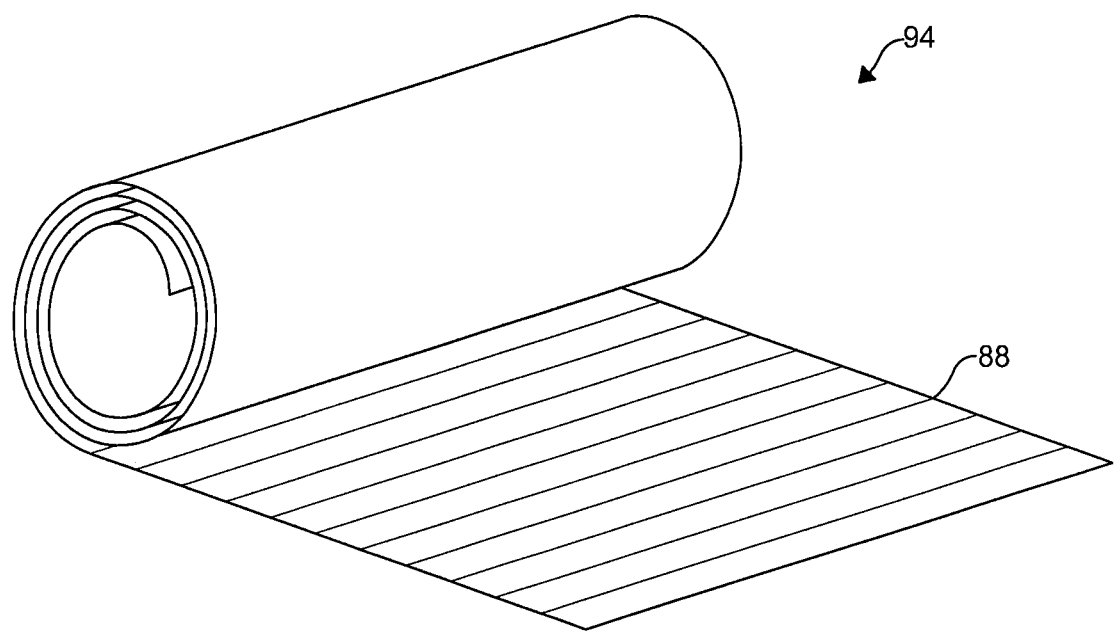
FIG. 9 is a perspective view of an embodiment of a roll-out-solar-array.

In another embodiment, a plurality of PV cells 10, 10A, monolithically interconnected with P1, P2, and P3 scribes, may have applications for space power generation. As in the case of UAV applications the very high power per unit mass is highly advantageous. Furthermore the flexibility of the finished mini-module 86 allows the mini-module to be rolled or folded into very compact configurations for stowage during rocket lift-off into orbit. This embodiment is illustrated in FIG. 9, which shows an array of mini-modules 88 electrically interconnected into a roll-out-solar-array (ROSA) 94.

The foregoing description is considered as illustrative only of the principles of the invention. Further, since numerous modifications and changes will readily occur to those skilled in the art, it is not desired to limit the invention to the exact construction and processes shown and described herein. Accordingly, all suitable modifications and equivalents may be considered as falling within the scope of the invention as defined by the claims, which follow.

The invention claimed is:

1. A method of making a photovoltaic cell, comprising:
providing a metal oxide substrate, wherein the metal oxide substrate is flexible, and wherein the metal oxide substrate is at least translucent to light;
directing the metal oxide substrate through a chamber;
depositing a semiconductor over a first major surface of the substrate, wherein the semiconductor comprises a deposition p-type layer;
providing a first electrode layer over the substrate, wherein the first electrode layer is provided between the metal oxide substrate and the semiconductor, and wherein the first electrode layer is at least translucent to light;
exposing the semiconductor to a chlorine-containing compound or a chlorine molecule; and
providing a second electrode layer over the semiconductor.

2. The method of claim 1, further comprising the step of:
providing a n-type layer over the substrate, wherein the n-type layer and the p-type layer form a semiconductor junction.

3. The method of claim 2, wherein the n-type layer is a polycrystalline n-type layer, and/or wherein the p-type layer is a polycrystalline p-type layer.

4. The method of claim 1, wherein the chlorine-containing compound is $CdCl_2$ or $MgCl_2$; or
wherein the metal oxide substrate comprises aluminum oxide or yttria stabilized zirconium dioxide.

5. The method of claim 1, further comprising the step of:
providing an outer member over the second electrode layer, wherein the outer member and the metal oxide substrate encapsulate at least a portion of the photovoltaic cell.

6. The method of claim 1, further comprising the step of:
providing an anti-reflective coating on a second major surface of the substrate.

7. The method of claim 1, wherein the chlorine-containing compound or the chlorine molecule is exposed to the semiconductor at a temperature of 350° C. or more, and wherein the chlorine-containing compound or the chlorine molecule passivates one or more grain boundaries in the semiconductor.

8. The method of claim 1, further comprising the steps of:
providing the metal oxide substrate as a roll of material; and
unwinding the roll of material as the metal oxide substrate is directed through the deposition chamber.

9. The method of claim 1, further comprising the step of:
winding the photovoltaic cell into a roll.

10. The method of claim 1, further comprising the steps of:
providing a first buffer layer over the first electrode layer, wherein the first buffer layer is provided between the first electrode layer and the semiconductor; or
providing a second buffer layer over the semiconductor, wherein the second buffer layer is provided between the semiconductor and the second electrode layer.

11. The method of claim 6, wherein the anti-reflective coating comprises one or more layers.

12. A method of making a photovoltaic cell, comprising:
providing a metal oxide substrate, wherein the metal oxide substrate is flexible, and wherein the metal oxide substrate is at least translucent to light;
directing the metal oxide substrate through a deposition chamber;
providing a first electrode layer over at least a portion of the metal oxide substrate, and wherein the first electrode layer is at least translucent to light;
depositing a semiconductor junction, wherein the semiconductor junction comprises a polycrystalline n-type layer and p-type layer over at least a portion of the first electrode layer;
exposing the semiconductor junction to a chlorine-containing compound or a chlorine molecule at a temperature of 350° C. or more;
providing a second electrode layer over the semiconductor junction; and
providing an outer member over the second electrode layer, wherein the outer member and the metal oxide substrate encapsulate at least a portion of the photovoltaic cell.

13. The method of claim 12, further comprising the steps of:
  providing a first buffer layer over the first electrode layer, wherein the first buffer layer is provided between the first electrode layer and the semiconductor; or
  providing a second buffer layer over the semiconductor, wherein the second buffer layer is provided between the semiconductor junction and the second electrode layer.

14. The method of claim 12, wherein the metal oxide substrate comprises aluminum oxide or yttria stabilized zirconium dioxide; or
  wherein the chlorine-containing compound is $CdCl_2$ or $MgCl_2$.

15. The method of claim 12, wherein exposure to the chlorine-containing compound or the chlorine molecule passivates one or more grain boundaries in the semiconductor.

16. The method of claim 12, wherein the n-type layer is CdS or CdSe.

17. The method of claim 12, wherein the p-type layer is CdTe.

18. The method of claim 2, wherein the n-type layer is CdS or CdSe.

19. The method of claim 1, wherein the p-type layer is CdTe.

* * * * *